US010186576B2

(12) United States Patent
Selvaraj et al.

(10) Patent No.: US 10,186,576 B2
(45) Date of Patent: Jan. 22, 2019

(54) DEVICE ISOLATOR WITH REDUCED PARASITIC CAPACITANCE

(71) Applicant: Texas Instruments Incorporated, Dallas, TX (US)

(72) Inventors: Raja Selvaraj, Bangalore (IN); Anant Shankar Kamath, Plano, TX (US); Byron Lovell Williams, Plano, TX (US); Thomas D. Bonifield, Dallas, TX (US); John Kenneth Arch, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 9 days.

(21) Appl. No.: 15/714,682

(22) Filed: Sep. 25, 2017

(65) Prior Publication Data

US 2018/0026095 A1    Jan. 25, 2018

Related U.S. Application Data

(62) Division of application No. 14/680,211, filed on Apr. 7, 2015, now Pat. No. 9,806,148.

(51) Int. Cl.
*H01L 29/06* (2006.01)
*H01L 21/76* (2006.01)
(Continued)

(52) U.S. Cl.
CPC ........ *H01L 29/0646* (2013.01); *H01L 21/265* (2013.01); *H01L 21/761* (2013.01); *H01L 23/5223* (2013.01); *H01L 23/5227* (2013.01); *H01L 23/5286* (2013.01); *H01L 24/05* (2013.01); *H01L 27/0676* (2013.01);
(Continued)

(58) Field of Classification Search
CPC ... H01L 21/76; H01L 21/761; H01L 29/0646; H01L 23/5222; H01L 23/5223; H01L 28/40; H01L 23/5227; H01L 28/10; H01L 28/60; H01L 28/20; H01L 24/05; H01L 29/0615; H01L 29/0619; H01L 29/0623
See application file for complete search history.

(56) References Cited

U.S. PATENT DOCUMENTS 6,399,990 B1    6/2002    Brennan et al.
6,903,918 B1    6/2005    Brennan
(Continued)

FOREIGN PATENT DOCUMENTS

WO        2012065229        5/2012

*Primary Examiner* — Thanhha Pham
(74) *Attorney, Agent, or Firm* — Andrew R. Ralston; Charles A. Brill; Frank D. Cimino

(57) ABSTRACT

Isolator structures for an integrated circuit with reduced effective parasitic capacitance. Disclosed embodiments include methods of forming an integrated circuit including an isolator structure. The isolator structure includes parallel conductive elements forming a capacitor or inductive transformer, overlying a semiconductor structure including a well region of a first conductivity type formed within an tank region of a second conductivity type. The tank region is surrounded by doped regions and a buried doped layer of the first conductivity type, forming a plurality of diodes in series to the substrate. The junction capacitances of the series diodes have the effect of reducing the parasitic capacitance apparent at the isolator

16 Claims, 6 Drawing Sheets

(51) Int. Cl.

| | | |
|---|---|---|
| *H01L 23/522* | (2006.01) | |
| *H01L 27/06* | (2006.01) | |
| *H01L 49/02* | (2006.01) | |
| *H01L 21/761* | (2006.01) | |
| *H01L 21/265* | (2006.01) | |
| *H01L 23/528* | (2006.01) | |
| *H01L 23/00* | (2006.01) | |

(52) U.S. Cl.
CPC .............. *H01L 28/10* (2013.01); *H01L 28/20* (2013.01); *H01L 28/40* (2013.01); *H01L 28/60* (2013.01); *H01L 2224/48463* (2013.01)

(56) References Cited

U.S. PATENT DOCUMENTS

| | | |
|---|---|---|
| 7,619,298 B1 | 11/2009 | Abughazaleh et al. |
| 8,890,223 B1 | 11/2014 | Bonifield et al. |
| 2008/0191277 A1* | 8/2008 | Disney ................ H01L 29/0638 257/343 |
| 2008/0277761 A1 | 11/2008 | Mahalingam et al. |
| 2009/0236683 A1 | 9/2009 | Williams et al. |
| 2010/0032769 A1 | 2/2010 | Hao et al. |
| 2013/0313679 A1 | 11/2013 | Summerfelt et al. |
| 2014/0097516 A1 | 4/2014 | Dubois et al. |

\* cited by examiner

DEVICE ISOLATOR WITH REDUCED PARASITIC CAPACITANCE

CROSS-REFERENCE TO RELATED APPLICATIONS

This application is a divisional of U.S. Nonprovisional Patent Application serial no. 14/680,211, filed Apr. 07, 2015, now issued as US Pat. No. 9,806,148, the contents of which is herein incorporated by reference in its entirety.

STATEMENT REGARDING FEDERALLY SPONSORED RESEARCH OR DEVELOPMENT

Not applicable.

BACKGROUND OF THE INVENTION

This invention is in the field of integrated circuits. Embodiments are more specifically directed to isolator structures in integrated circuits.

As well known in the art, some implementations of modern integrated circuits require the communication of signals between integrated circuits that are not referenced to the same ground voltage, either (or both) in the DC and AC sense. In those implementations, the direct coupling of input/output terminals could result in a significant voltage differential between the respective ground levels. In some applications, this ground voltage differential can be as high as hundreds or thousands of volts, sufficient to damage the integrated circuits and cause system failure. Similarly, transient high voltage spikes at one of the integrated circuits can couple via the connected input/output terminals to other integrated circuits. For example, a typical voltage spike at a high voltage motor can couple from a motor controller device at the motor to an integrated circuit at a human interface device (e.g., keypad); such spikes can cause damage and, in the case of a human interface device, can affect the human user.

Isolator structures are commonly implemented into integrated circuits intended for these applications, with those structures deployed at the input/output terminals. These isolator structures are typically in the form of capacitors or inductors. For the example of an isolator constructed as a capacitor, the capacitor is inserted in series between the terminal or pad and the internal circuit. The goal of these isolator structures 5 is to absorb the voltage differential between ground levels (or the transient spike) with minimum attenuation of signal information.

FIG. 1a illustrates, in cross-section, the construction of a conventional isolator structure in the form of high voltage capacitor 7 deployed in an integrated circuit. In this arrangement, capacitor 7 is a parallel-plate capacitor in which upper plate 8a and lower plate 8b are formed in separate metal levels. In this example, capacitor 7 is deployed directly at an external terminal (e.g., an input) of the integrated circuit, as evident by wire bond 5 attached to the bond pad (exposed through protective overcoat 9 and top dielectric layer 10h) that serves as exposed upper plate 8a. In this conventional example, integrated circuit 4 is fabricated to have seven levels of metal conductors, with lower plate 8b formed in the second metal level and upper plate 8a formed in the seventh (topmost) metal level. Accordingly, the intervening dielectric between upper and lower plates 8a, 8b includes five layers 10c through 10g of interlevel dielectric material (e.g., silicon dioxide); two interlevel dielectric layers 10a, 10b underlie lower plate 8b, separating it from substrate 11 and isolation dielectric structure 12. Each of interlevel dielectric layers 10 serves to insulate adjacent levels of metallization in the vertical direction in the cross-section of FIG. 1a. As such, interlevel dielectric layers 10c through 10g between upper and lower plates 8a, 8b are formed between the formation and patterned etch of each of the intervening metal levels that form conductors elsewhere in the integrated circuit. The relatively large cumulative thickness of interlevel dielectric layers 10c through 10g results in capacitor 7 being capable of withstanding and absorbing relatively high voltages.

In addition to capacitor 7 formed between upper and lower plates 8a, 8b, a parasitic capacitor is defined by the structure shown in FIG. 1a. Specifically, parasitic parallel-plate capacitor 7p is present between lower plate 8a and substrate 11 disposed under lower plate 8b, with the capacitor dielectric formed of interlevel dielectric layers 10a, 10b, and isolation oxide structure 12 beneath interlevel dielectric layer 10a. Isolation oxide structure 12 is a conventional dielectric structure formed into substrate 11, typically with the purpose of isolating adjacent transistors formed at the surface of substrate 11 from one another; isolation oxide structure 12 may be formed by thermal oxidation (e.g., the well-known LOCOS process) or as shallow trench isolation. Because the cumulative thickness of interlevel dielectric layers 10a, 10b, and isolation oxide structure 12 can be substantially less than that of interlevel dielectric layers 10c through 10g, parasitic capacitor 7p can present a significantly larger capacitance than does high voltage capacitor 7.

The electrical effect of parasitic capacitor 7p is illustrated in FIG. 1b. High voltage capacitor 7 couples terminal 5 of the integrated circuit (i.e., wire bond 5 of FIG. 1a) to internal node 13, which is typically coupled to the internal functional circuitry of the integrated circuit. However, parasitic capacitor 7p also couples input 5 to a fixed voltage level, for example the substrate voltage Vsub at substrate 11 of the integrated circuit (e.g., a ground level), which can cause attenuation of the signal level received at input 5 from that reaching internal node 13. In an example in which high voltage capacitor 7 has a cumulative dielectric thickness (i.e., of interlevel dielectric layers 10c through 10g cumulatively) of 12.7 µm between upper and lower plates 8a, 8b, and parasitic capacitor 7p has a cumulative dielectric thickness (i.e., interlevel dielectric layers 10a and 10b and isolation dielectric structure 12 cumulatively) of 2.8 µm between lower plate 8b and substrate 11, parasitic capacitor 7p may present a capacitance more than ten times that of high voltage capacitor 7 (e.g., 400 fF vs. 30 fF). Fundamental circuit analysis shows that parasitic capacitor 7p results in the signal level at internal node 13 being only about 10 percent of the magnitude of that received at input 5.

By way of further background, another conventional isolator structure is constructed similarly as capacitor 7 of FIG. 1a, but includes a doped well underlying the bottom plate. With reference to the structure of FIG. 1a, this structure would have such a doped well in place of isolation dielectric structure 12 (albeit at a shallower depth), with the doping of that well opposite to that of substrate 11 (e.g., an n-well formed into p-type substrate 11).

In either of these conventional structures, conventional approaches to reducing the capacitance of parasitic capacitor 7p have been problematic. For example, forming lower plate 8b in a higher level of metal would increase the dielectric thickness between lower plate 8b and substrate 11, reducing its capacitance. However, this would also have the effect of reducing the dielectric thickness between lower plate 8b and upper plate 8a, as the dielectric of capacitor 7 would be thinner (i.e., fewer interlevel dielectric layers 10 between the plates). This reduced dielectric thickness would, in turn, reduce the high voltage isolation capability of capacitor 7. Another approach would be to form both lower plate 8b and upper plate 8a in higher levels of metal, to increase the dielectric thickness between lower plate 8b and substrate 11 while maintaining the same dielectric thickness for capacitor 7. However, as evident from FIG. 1a, upper plate 8a may already be constructed in the highest metal level in the integrated circuit; accordingly, this approach could require increasing the number of metal conductor levels from what it otherwise would be, which increases the manufacturing cost of the integrated circuit.

As mentioned above, integrated inductors are also used as isolator structures, for example in the form of an isolating transformer. Conventional inductive isolator structures are similar to that shown in FIG. 1a, except that, instead of a parallel plate structure, the two metal conductor levels are patterned as a pair of overlying coils of sufficient length to define the desired inductance and coupling to one another. However, a parasitic capacitance similar to that shown as parasitic capacitor 7p would be presented between the lower coil and the underlying substrate. This parasitic capacitor can similarly attenuate the signal magnitude communicated through the isolator structure, as discussed above.

BRIEF SUMMARY OF THE INVENTION

Disclosed embodiments provide an isolator structure with reduced parasitic capacitance.

Disclosed embodiments provide such an isolator structure that does not reduce high voltage isolation capability.

Disclosed embodiments provide such an isolator structure that may be readily implemented without requiring additional metal levels.

Disclosed embodiments provide a method of fabricating such an isolator structure in existing manufacturing process flows.

Disclosed embodiments provide an electronic system including an integrated circuit having such an isolator structure at an external terminal connected to another integrated circuit.

Other objects and advantages of the disclosed embodiments will be apparent to those of ordinary skill in the art having reference to the following specification together with its drawings.

According to certain embodiments, an isolator structure is formed near a semiconducting surface of a substrate, in a pair of patterned metal conductor elements overlying one another above the surface, separated from one another by dielectric material and with the lower of the elements separated from the surface by dielectric material. The lower element overlies a portion of the substrate of a first conductivity type that is surrounded by doped portions of a second conductivity type, and that overlies a buried doped portion of the second conductivity type. The surrounding doped portions and the buried doped portion are physically in contact on another, isolating the first conductivity type portion underlying the lower element.

According to other embodiments, the doped portions are electrically connected to receive bias voltages so as to reverse bias the p-n junctions among the doped regions.

BRIEF DESCRIPTION OF THE SEVERAL VIEWS OF THE DRAWING

FIG. 1b is an electrical diagram, in schematic form, of the equivalent circuit of the conventional structure of FIG. 1a.

DETAILED DESCRIPTION OF THE INVENTION

The one or more embodiments described in this specification are implemented into isolator structures in an integrated circuit, as it is contemplated that such implementation is particularly advantageous in that context. However, it is also contemplated that concepts of this invention may be beneficially applied to in other applications. Accordingly, it is to be understood that the following description is provided by way of example only, and is not intended to limit the true scope of this invention as claimed.

As discussed above in connection with the Background of the Invention, some electronic systems are implemented with separate integrated circuits that are not referenced to the same ground voltage, but which must still communicate with one another. Interconnection of these integrated circuits to one another, for example by connecting input/output terminals to one another for the communication of signals, will also couple the voltage differential between the respective ground levels. As noted above, this ground voltage differential can be sufficiently high as to damage the integrated circuits, cause system failure, and, in the case of transient high voltage spikes, can be coupled further downstream, including to a human user. As such, isolator structures are commonly implemented into integrated circuits intended for these applications, with those structures deployed at the input/output terminals.

Figure 2:
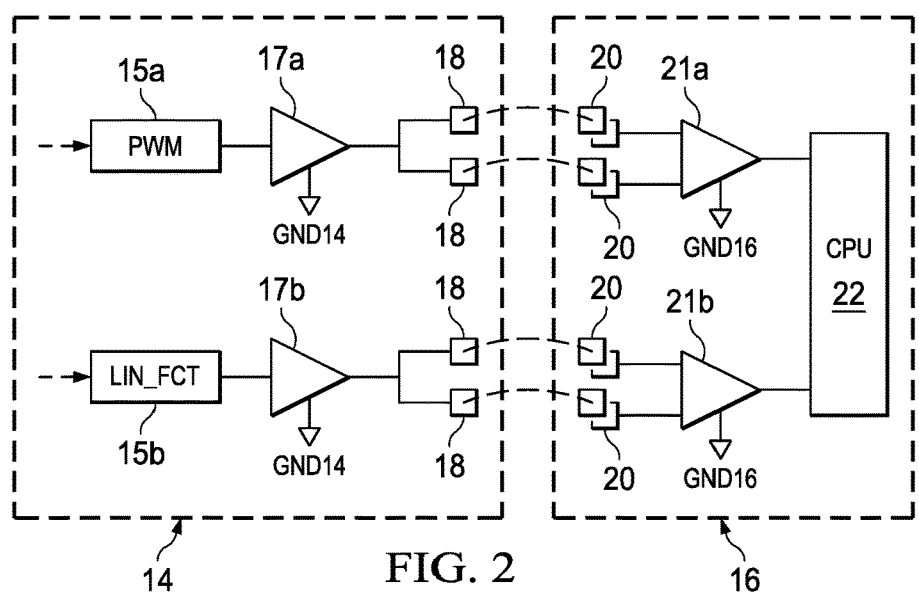
FIG. 2 is an electrical diagram, in block form, of an electronic system constructed according to disclosed embodiments.

FIG. 2 illustrates a portion of an electronic system including integrated circuits 14, 16 that are connected to one another. In this example, integrated circuit 14 serves as a transmitter of signals to integrated circuit 16, which is thus the receiver. In this example, integrated circuit 14 includes functional circuitry, such as pulse-width modulator 15a and linear function 15b, each of which are coupled via respective output drivers 17a, 17b to output terminals 18. These output terminals 18 of integrated circuit 14 are directly connected to input terminals of integrated circuit 16, at which isolator structures 20 are deployed according to these embodiments. While not shown, similar isolator structures may be implemented at output terminals 18 of integrated circuit 14. As evident from FIG. 2, isolator structures 20 communicate the received signals to input amplifiers 21a, 21b, which in turn are coupled to CPU 22 in this example. In this example, output drivers 17a, 17b of integrated circuit 14 are referenced to one ground level GND14, while input amplifiers 21a, 21b of integrated circuit 16 are referenced to a different ground level GND16. As discussed above, these ground levels GND14, GND16 may be at significantly different voltages from one another, relative to some external reference, and as such that difference will couple between integrated circuits 14, 16. According to these embodiments, isolator structures 20 may be constructed as capacitors or inductive transformers that are sufficient to absorb the differential between ground levels and also any transient voltage spikes from integrated circuit 14, while minimizing attenuation of the communicated signal.

Figure 3A:
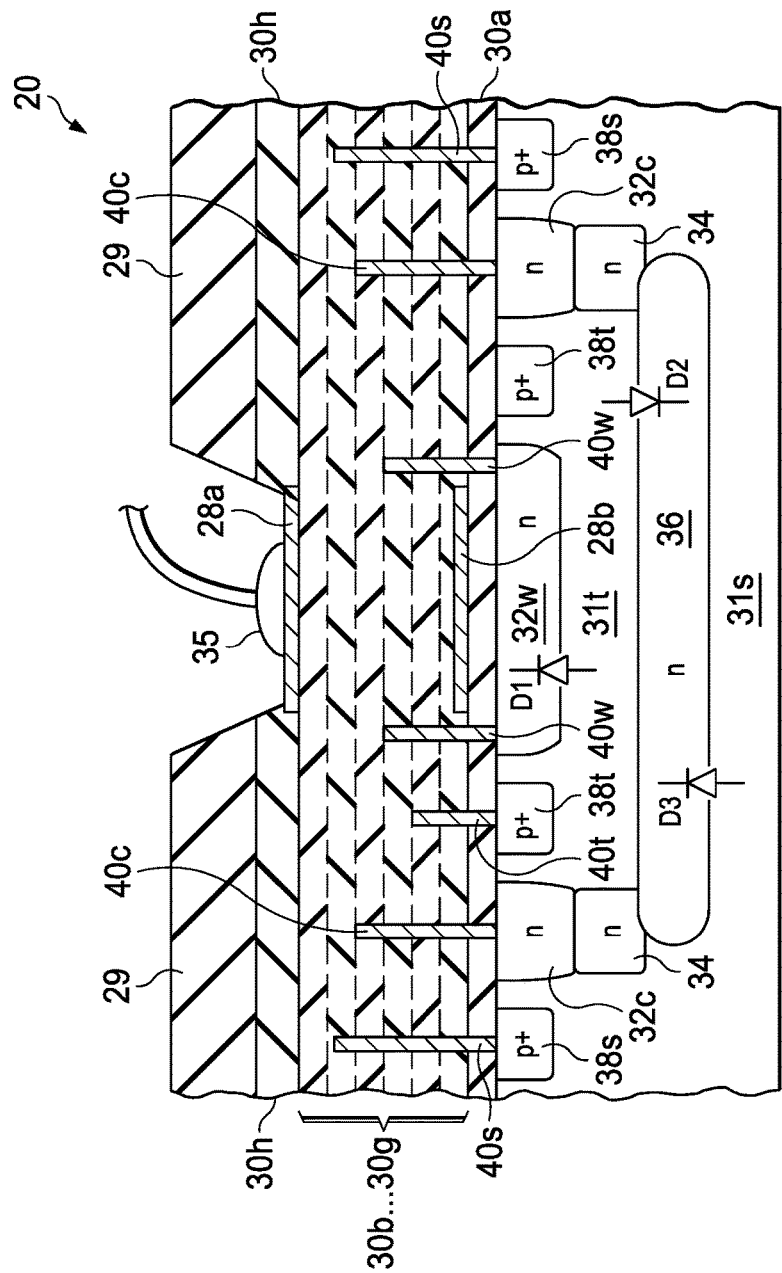
FIG. 3a is a cross-sectional view of a portion of an isolator structure constructed according to disclosed embodiments.
Figure 3B:
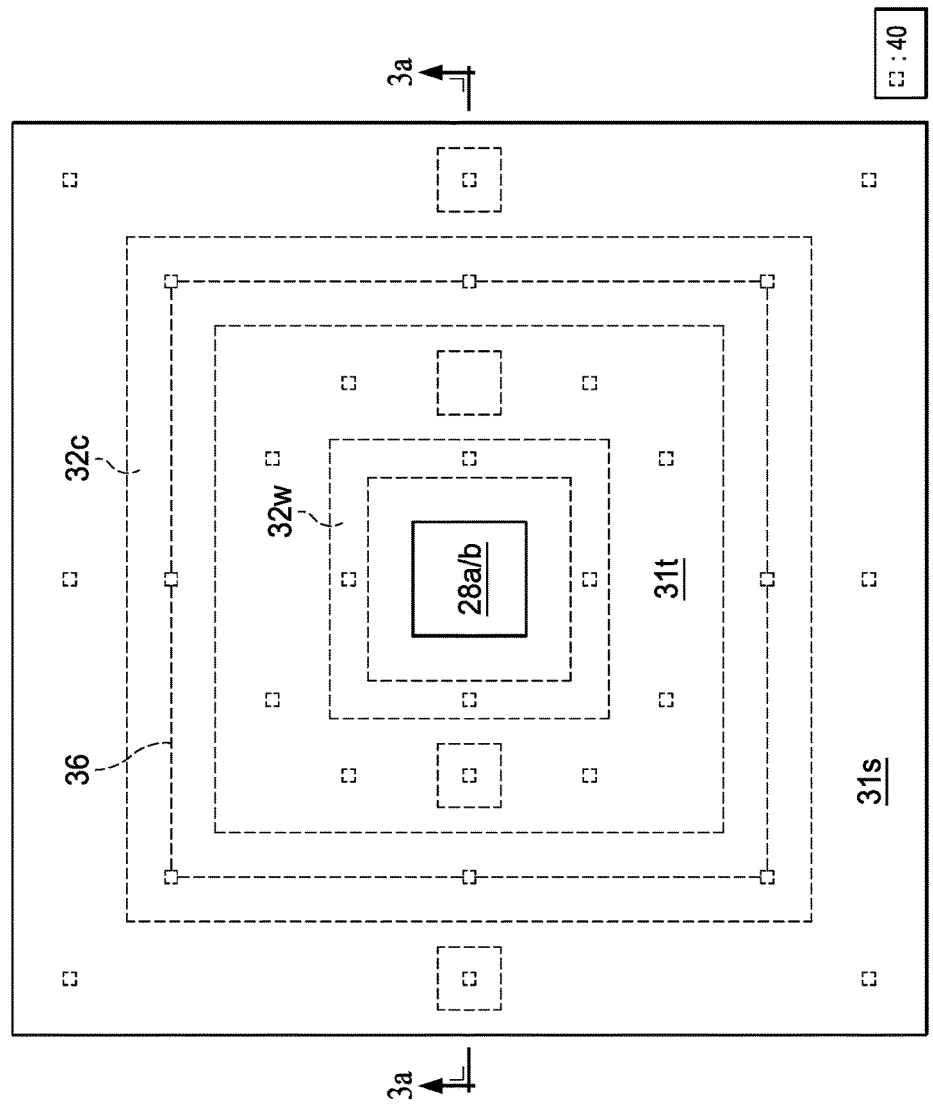
FIG. 3b is a plan view of the isolator structure of FIG. 3a, as a capacitor.

FIGS. 3a and 3b illustrate, in cross-section and plan views, respectively, the construction of isolator structure 20 in integrated circuit 16 according to an embodiment. This example will be described for the example in which isolator structure 20 is in the form of a parallel-plate capacitor formed by upper plate 28a and lower plate 28b. Alternatively, isolator structure 20 may be formed as an inductive transformer having a similar cross-section to that of FIG. 3a, but differing in the shape of the parallel elements as will be discussed below. As shown in FIG. 3a, wire bond 35 is attached to upper plate 28a; as such, upper plate 28a serves as a bond pad, connected directly to an external terminal of integrated circuit 16, and as such is formed in an upper if not topmost metal conductor level. Wire bond 35 extends through an opening etched in protective overcoat 29 and interlevel dielectric layer 30h, in the conventional manner. While a ball bond is illustrated in FIG. 3a, it is of course contemplated that external contact to upper plate 28a may be made according to any one of a number of techniques, depending on the packaging technology, including stitch bonding, beam lead contact, solder bumps, and the like.

Alternatively, isolator structure 20 may be indirectly coupled to the external terminal, for example by either of upper and lower plates 28a, 28b being connected by way of an intermediate conductor to the bond pad receiving bond wire 35. However, it is contemplated that isolator structure 20 most efficiently isolates integrated circuit 16 by its implementation directly at the bond pad or otherwise directly in contact with the external terminal.

According to this embodiment, integrated circuit 16 is constructed with multiple metal conductor levels, with upper plate 28a in the topmost or at least an upper one of those levels, as mentioned above. Conversely, lower plate 28b is implemented in a lower metal conductor level, such as the first or second metal level, as shown in FIG. 3a. Alternatively, lower plate 28b may be formed of polycrystalline silicon, such as used to realize transistor gate elements; as known in the art, polysilicon levels are typically formed beneath all metal conductor levels, typically as the first conductive layer above the semiconductor surface of the substrate. In the example of FIG. 3a, in which several metal conductor levels are used within integrated circuit 16, several interlevel dielectric layers 30b through 30g vertically separate lower plate 28b from upper plate 28a. These interlevel dielectric layers 30b through 30g constitute the capacitor dielectric of isolator structure 20 in this embodiment.

In this embodiment, lower plate 28a overlies n-type well 32w, separated therefrom by interlevel dielectric layer 30a and any remaining gate dielectric (not shown). As known in the art for complementary metal-oxide-semiconductor (CMOS) integrated circuits, n-well region 32w is a typical n-doped region formed into the surface of p-type substrate or a p-type epitaxial layer, as the case may be. As shown in FIG. 3a, n-well region 32c is similarly disposed at the surface, separated from and surrounding n-well 32w as evident in FIG. 3b. In this example, n-type well 32w is at the surface of p-type tank region 31t, which is formed of p-type epitaxial single-crystal silicon. P-type tank region 31t overlies n-type buried layer 36, which is formed within p-type substrate 31s. N-type buried layer 36 vertically separates p-type substrate 31s from p-type tank region 31t. As evident from FIG. 3a, n-type buried layer 36 laterally extends beyond the lateral dimensions of n-well 32w, and is in contact with n-type buried isolation region 34.

Buried isolation region 34 is disposed beneath but in contact over its length with n-well region 32c. As mentioned above, n-well region 32c surrounds n-well 32w; similarly, buried isolation region 34 surrounds n-well 32w, and is in contact over its length with n-type buried layer 36 over its length. Accordingly, the combination of n-well region 32c, buried isolation region 34, and n-type buried layer 36 surrounds and defines p-type tank region 31t as a p-type region that is electrically isolated from p-type substrate 31s within the silicon structure (i.e., the bulk). FIG. 3b illustrates that n-well region 32w extends on all sides of lower plate 28b, p-type tank region 31t surrounds n-well region 32w, and n-well region 32c surrounds p-type tank region 31t. As shown in FIGS. 3a and 3b, p-type substrate 31s extends to the surface of the single-crystal silicon at locations outside of n-well region 32c, relative to lower plate 28b.

According to this embodiment, the metallurgical junction (i.e., p-n junction) between n-well region 32w and p-type tank region 31t is electrically reflected in a diode, shown in FIG. 3a as diode D1. Similarly, the p-n junction between p-type tank region 31t and n-type buried layer 36 (and buried isolation region 34 and n-type well region 32c, for that matter) establishes diode D2, and the p-n junction between n-type buried layer 26 and p-type substrate 31s establishes D3. As will be described in further detail below, these p-n junctions (i.e., diodes) each present a significant junction capacitance to the structure, and have the effect of reducing the effective parasitic capacitance presented to isolator structure 20.

In this embodiment, metal conductors 40 are provided to apply bias voltages to at least some of the doped regions of isolator structure 20, specifically to reverse bias the p-n junctions. In the example shown in FIG. 3a, metal conductors 40w contact p+ doped regions 38s that are disposed at one or more surface locations of substrate 31s. P+ doped regions 38s are more heavily-doped regions formed into the surface, for example having dopant concentrations similar to p-type source/drain regions in PMOS transistors formed elsewhere in integrated circuit 16, that assist the forming of ohmic contact between overlying metal conductors 40s and substrate 31s. These metal conductors 40w include both the metal lines running in one of the metal conductor levels of integrated circuit 16 (the second level from the topmost in this case), metal lines running into and out of the page in the view of FIG. 3a, and the conductive plugs formed in vias through the various interlevel dielectric layers 30 between that metal conductor level and the surface of p+ doped region 38s. Similarly, metal conductors 40c contact one or more of surrounding n-well regions 32c (which may similarly have a more heavily-doped n-type portion at the surface to provide ohmic contact, similarly to p+ doped regions 38s, depending on the dopant concentration of n-well region 32c), including plugs extending to one of the metal conductor levels and the metal line at that level. Similarly, metal conductor 40t contacts p+ doped regions 38t at one or more surface locations of tank region 31t, and metal conductors 40w contacts (via heavily doped n-type contact regions, if desired) at one or more surface locations of n-well region 32w.

Figure 3C:
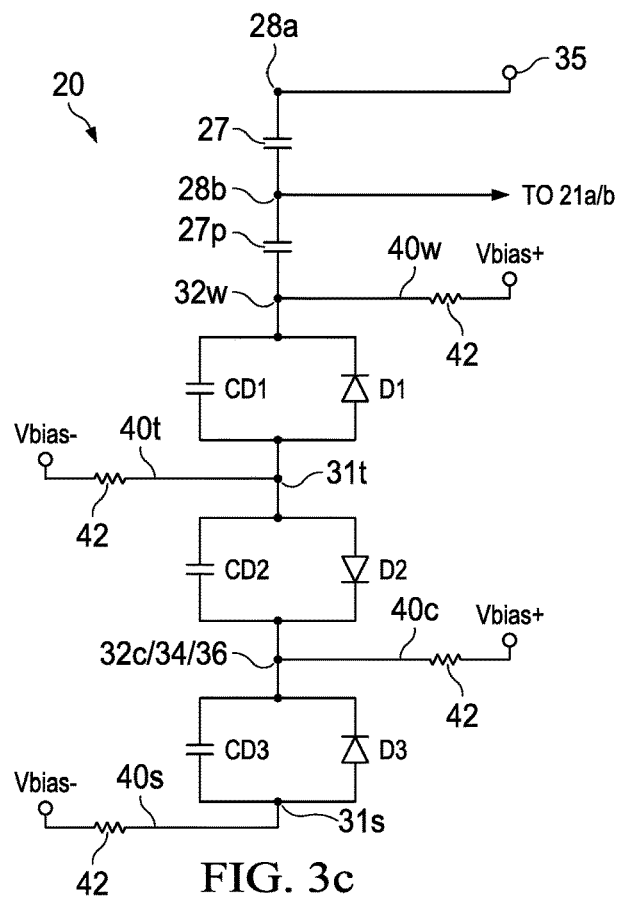
FIG. 3c is an electrical diagram, in schematic form, of the equivalent circuit of the isolator structure of FIGS. 3a and 3b.

FIG. 3c is an electrical schematic illustrating the equivalent circuit of isolator structure 20 of FIGS. 3a and 3b. As shown in FIG. 3c, upper plate 28a and lower plate 28b form capacitor 27, with upper plate 28a shown as the node connected to bond wire 35 (and thus to an external terminal of integrated circuit 16), and lower plate 28b as the node connected to one of input amplifiers 21a, 21b (FIG. 2). Parasitic capacitor 27p is formed between lower plate 28b and n-well region 32w.

As noted above, the construction of isolator structure 20 according to this embodiment adds p-n junctions and corresponding junction capacitances, to the structure below lower plate 28b. As shown in the schematic of FIG. 3c, the p-n junction between n-well region 32w and tank region 31t presents diode D1 and its junction capacitance CD1. The p-n junction between tank region 31t and the combination of n-well region 32c, buried isolation regions 34, and n-type buried layer 36 presents diode D2 and its junction capacitance CD2, and the p-n junction between n-well regions 32c, buried isolation regions 34, and n-type buried layer 36, on one hand, and p-type substrate 31s on the other hand, presents diode D3 and its junction capacitance CD3. The capacitance values of these junction capacitances CD1, CD2, CD3 will depend on the dopant concentrations of the contacting regions at the metallurgical junction, as well as the area of that junction.

These junction capacitances CD1, CD2, CD3 are effectively in series with parasitic capacitor 27p between capacitor 27 of isolator structure 20 and substrate 31s. Applying fundamental circuit analysis to this structure, the effect of these series capacitances CD1, CD2, CD3 is to reduce the parasitic capacitance at lower plate 28b from that which would be presented by parasitic capacitor 27p alone, for example by on the order of 20% in one implementation.

As noted above relative to FIG. 3a, conductors 40 allow the application of bias voltages to the various regions of isolator structure 20, in particular bias voltages that establish a reverse bias condition across each of the p-n junctions. As is well-known in the art, application of a reverse bias voltage to a p-n junction increases the width of the space-charge region at the junction, and thus increases the effective junction capacitance presented by the junction. For example, application of a voltage Vbias+ to n-well region 32w and n-type buried layer 36 (via regions 32c, 34), and a voltage Vbias− to tank region 31t and substrate 31s, where voltage Vbias+ is greater than voltage Vbias−, will increase the capacitance values of junction capacitances CD1, CD2, CD3. This increase in those series capacitances CD1, CD2, CD3, in the circuit arrangement of FIG. 3c, will further reduce the effective parasitic capacitance at lower plate 28b. For example, application of bias voltage Vbias+ of about 1.8 volts (relative to bias voltage Vbias− at ground) has been observed to reduce the overall parasitic capacitance by on the order of 25% from that of the unbiased condition, or on the order of 40% overall. While bias voltages Vbias+, Vbias− need not be applied to isolator structure 20 in order to obtain significant reduction in the parasitic capacitance presented by parasitic capacitor 27p, and as such is an optional feature in these embodiments, the application of these bias voltages Vbias+, Vbias− further reduces the effective parasitic capacitance.

As shown in the electrical schematic of FIG. 3c, the bias voltages Vbias+, Vbias− are applied to each instance of the respective conductors via a resistor 42. In this embodiment, resistors 42 are relatively large resistors, with resistances on the order of tens of thousands of ohms (e.g., 30 kΩ). These resistors 42 ensure that the voltage sources applying bias voltages Vbias+, Vbias− do not establish a low impedance path that would effectively short circuit diodes D1, D2, D3. While not shown in FIGS. 3a, 3b, it is contemplated that resistors 42 may be constructed in the conventional manner for high value resistors, such as by way of lightly-doped polysilicon structures or doped regions formed into the bulk.

Figure 3D:
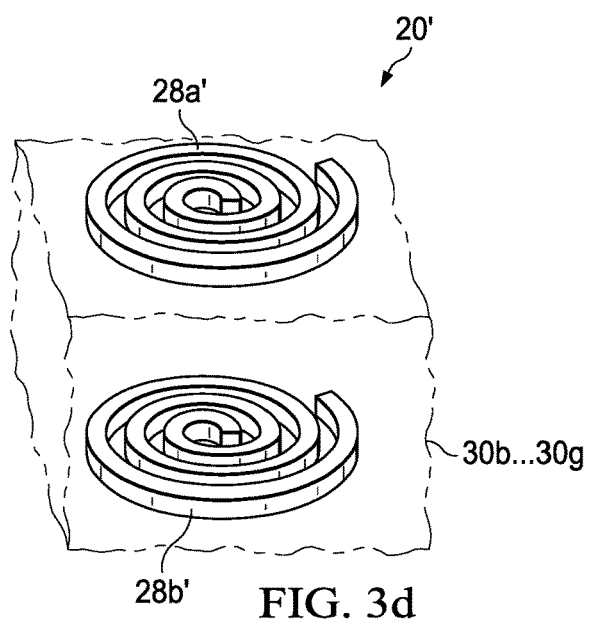
FIG. 3d is a perspective view of the isolator structure of FIG. 3a, as an inductive transformer.

As mentioned above, the isolator structure according to these embodiments may be realized as an inductive transformer rather than as a capacitor as shown in FIGS. 3a and 3b. According to one embodiment, as shown in a perspective view in FIG. 3d, an inductive transformer implementation of isolator structure 20' is constructed to include upper and lower coils 28a', 28b' in different metal conductor levels, separated from one another by interlevel dielectric layers 30 similarly as shown in FIG. 3a, but with each in the shape of a coil to form an inductor. Because of its coil shape, upper coil 28a' will typically be connected to a bond pad to receive wire bond 35, rather than itself serve as the bond pad. The underlying structure of isolator structure 20' corresponds to that described above relative to the capacitive implementation of FIGS. 3a through 3c. And similarly, while parasitic capacitance 27p is also presented in this isolator structure 20' between lower coil 28b' and n-well 32, the construction of isolator structure 20' in this manner to include series diodes D1 through D3 and the corresponding junction capacitances CD1 through CD3 reduces the effect of that parasitic capacitance, and thus reduces the attenuation on the received signal.

While the above description refers to certain of the doped regions in isolator structure 20 as n-type and others as p-type, it is of course contemplated that the structure may alternatively be constructed using doped regions and a substrate of opposite conductivity types (i.e., the n-type and p-type regions shown in FIG. 3a instead being p-type and n-type, respectively). In that alternative construction, of course, the relative polarity of the applied bias voltages Vbias+, Vbias− will be reversed, so as to maintain reverse biased junctions by ensuring that the higher voltage is applied to n-type regions and the lower voltage is applied to p-type regions.

It is contemplated that the isolator structure, whether as a capacitor or as a an inductive transformer, may be fabricated according to these embodiments using process flows already in place for modern integrated circuits. In particular, it is contemplated that such isolator structures may be implemented into a conventional CMOS process flow utilizing buried layers merely by way of changes to photomasks, and without significant change to the manufacturing process. Accordingly, it is contemplated that those skilled in the art having reference to this specification will be readily able to derive a workable manufacturing process flow, without undue experimentation. For example, commonly assigned U.S. Patent Application Publication No. US 2010/0032769 A1, published Feb. 11, 2010 and incorporated herein by this reference, describes a fabrication process suitable for the construction of integrated circuits including isolator structures according to the embodiments described above.

Figure 4:
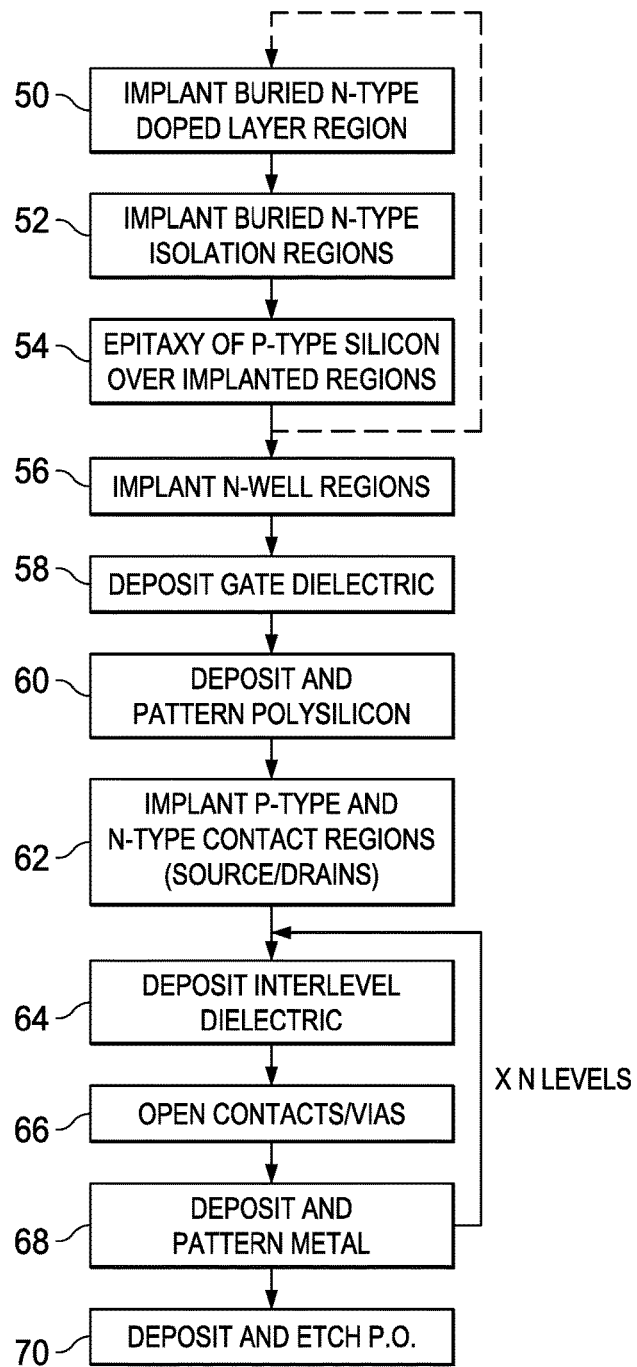
FIG. 4 is a flow diagram illustrating a method of fabricating an isolator structure according to disclosed embodiments.

Referring now to FIG. 4 (together with FIG. 3a), an example of a process of forming isolator structure 20 in an integrated circuit according to an embodiment, generally following the approach described in the above-incorporated Patent Application Publication, will be described. According to this embodiment, the fabrication process begins with process 50, in which masked ion implantation of n-type dopant is performed to selected locations of a p-type substrate to define the location of n-type buried layer 36. As described in the above-incorporated Patent Application Publication No. US 2010/0032769, implant process 50 may implant n-type dopants such as antimony at a dose and energy sufficient to place the desired amount of dopant to a desired depth within the substrate. In this embodiment, epitaxial silicon will be grown at the surface; as such, process 50 may be performed by a conventional ion implantation at the surface of the substrate. Process 50 may also include a high temperature anneal to diffuse the implanted dopant to at least a partial extent in the substrate. Similarly, implant process 52 involves the masked ion implantation of n-type dopant, such as phosphorous and possibly including arsenic, at locations of the surface of the substrate at which n-type buried isolation region 34 is to be implanted. In this embodiment, as indicated in FIG. 3b, the locations implanted in process 52 include a boundary region encircling the eventual location of the capacitor or transformer to serve as the isolator element.

In process 54 according to this embodiment, epitaxial growth of silicon is then performed, to grow a layer of p-type silicon at the surface of the p-type substrate. The thickness of this epitaxial layer is intended to be sufficient to define tank region 31t of FIG. 3a above n-type buried layer 36 and n-type buried isolation region 34. As described in the above-incorporated Patent Application Publication No. US 2010/0032769, the temperature and duration of epitaxy process 54 is sufficient to diffuse the dopant implanted in process 52 and to further diffuse the dopant implanted in process 50, effectively forming the structures of n-type buried layer 36 and n-type buried isolation region 34 as shown in FIG. 3a, with p-type epitaxial silicon overlying those regions. This diffusion is also contemplated to cause n-type buried isolation region 34 to grow into and contact n-type buried layer 36, and thus isolate p-type tank region 31t from substrate 31s (substrate 31s now including p-type epitaxial material overlying and in contact with the original substrate).

In process 56, n-well regions 32w and 32c are implanted at selected locations into the surface of the structure, which is now the surface of the p-type epitaxial silicon formed in process 54. In particular, the implant of process 56 implants n-type dopant (e.g., phosphorous, arsenic) at a location within tank region 31t and underlying the eventual location of lower plate 28b, to form n-well region 32w, and at locations overlying n-type buried isolation region 34, to form n-well region 32c. The dose and energy of this well implant is selected in the conventional manner to form the well regions appropriate for p-channel MOS transistors elsewhere in the integrated circuit, for example. Process 56 also includes the appropriate high temperature anneal for diffusing the implanted dopant to the desired depth and profile. For purposes of isolator structure 20 of this embodiment, the dose, energy, and anneal conditions of process 56 are selected so that n-well region 32c reach and contact the underlying n-type buried isolation region 34, as shown in FIG. 3a.

In process 58, a dielectric layer is formed overall, for example by thermal oxidation of the semiconductor surface or by deposition of the desired dielectric material. Typically, for integrated circuits including MOS transistors, process 58 forms the gate dielectric film. Following process 58, polycrystalline silicon is deposited in this embodiment, followed by patterning and etching of the polysilicon to define the desired structures in the integrated circuit, for example transistor gate structures. This polysilicon may be doped in situ during its deposition, or alternatively may be implanted after deposition and etch. For the embodiment in which resistors 42 are incorporated into isolator structure 20, process 60 may form these resistors 42 in polysilicon deposited and defined in this process 58, particularly with that polysilicon being relatively lightly-doped (if at all) so as to have a high resistance and thus efficiently implement a high resistor value (e.g., 30 kΩ).

Figure 1A:
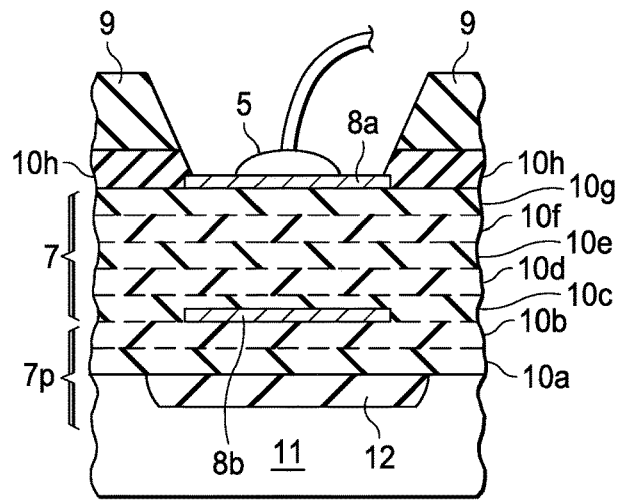
FIG. 1a is a cross-sectional view of a portion of a conventional isolator capacitor structure.
Figure 1B:
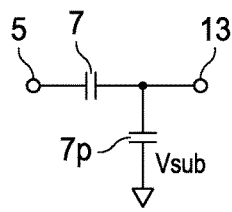

If desired, lower plate 28b may be formed in this polysilicon level, rather than in a metal level. While this would increase the parasitic capacitance in conventional isolator structures, such as that shown in FIG. 1a, when implemented according to this embodiment, the series junction capacitances CD1, CD2, CD3 at the underlying p-n junctions serve to reduce that parasitic capacitance. This reduction in the parasitic capacitance may, in some implementations allow the formation of lower plate 28b in polysilicon rather than in a higher metal level, thus improving the high voltage capability of the isolator or, in some cases, enable the reduction of the number of metal levels required without affecting the high voltage tolerance.

In process 62, typically following the defining of polysilicon elements in MOS integrated circuits, n-type and p-type source/drain regions are formed by ion implantation of the appropriate dopant species, followed by high temperature anneal. In this embodiment p+ contact regions 38s, 38t (FIG. 3a) are also formed in this source/drain anneal process 62, as are corresponding n+ contact regions in n-well regions 32w, 32c if desired.

Conductor levels including those used to form lower plate 28b and upper plate 28a are the formed by a sequence of processes 64, 66, 68. In process 64, an interlevel dielectric layer 30, such as silicon dioxide or silicon nitride, is deposited by conventional processes to the desired thickness. In process 66, contact openings (for metal to silicon contacts) or vias (for metal to metal contacts) are patterned and etched. Deposition of contact plugs as appropriate to fill vias opened in process 66, and deposition of a metal layer are then performed in process 68. Process 68 also includes the desired photolithographic patterning and metal etch to define the metal conductors to be formed in this particular level of metal. As described above, this integrated circuit 16 is contemplated to be constructed with multiple metal conductor levels; as such, processes 64, 66, 68 are repeated a number of times corresponding to the number of metal levels to be formed. If not previously formed in polysilicon, as described above, lower plate 28a may be formed in one of the lower metal levels formed in this sequence of processes, 64, 66, 68; upper plate 28a will be formed in a higher one of those metal levels, to attain the desired high voltage capability of the isolator.

Following the formation and patterning of the topmost metal layer in the last instance of process 68, process 70 is then performed to deposit a protective overcoat, such as silicon nitride, overall. Process 70 also includes the patterned etch of openings through this protective overcoat, such as that etched over upper plate 28a to allow contact by bond wire 35 as shown in FIG. 3a. Such other "back end" processing as appropriate to complete, test, and package integrated circuit 16 as desired for its system implementation such as shown in FIG. 2 may then be carried out.

Figure 5:
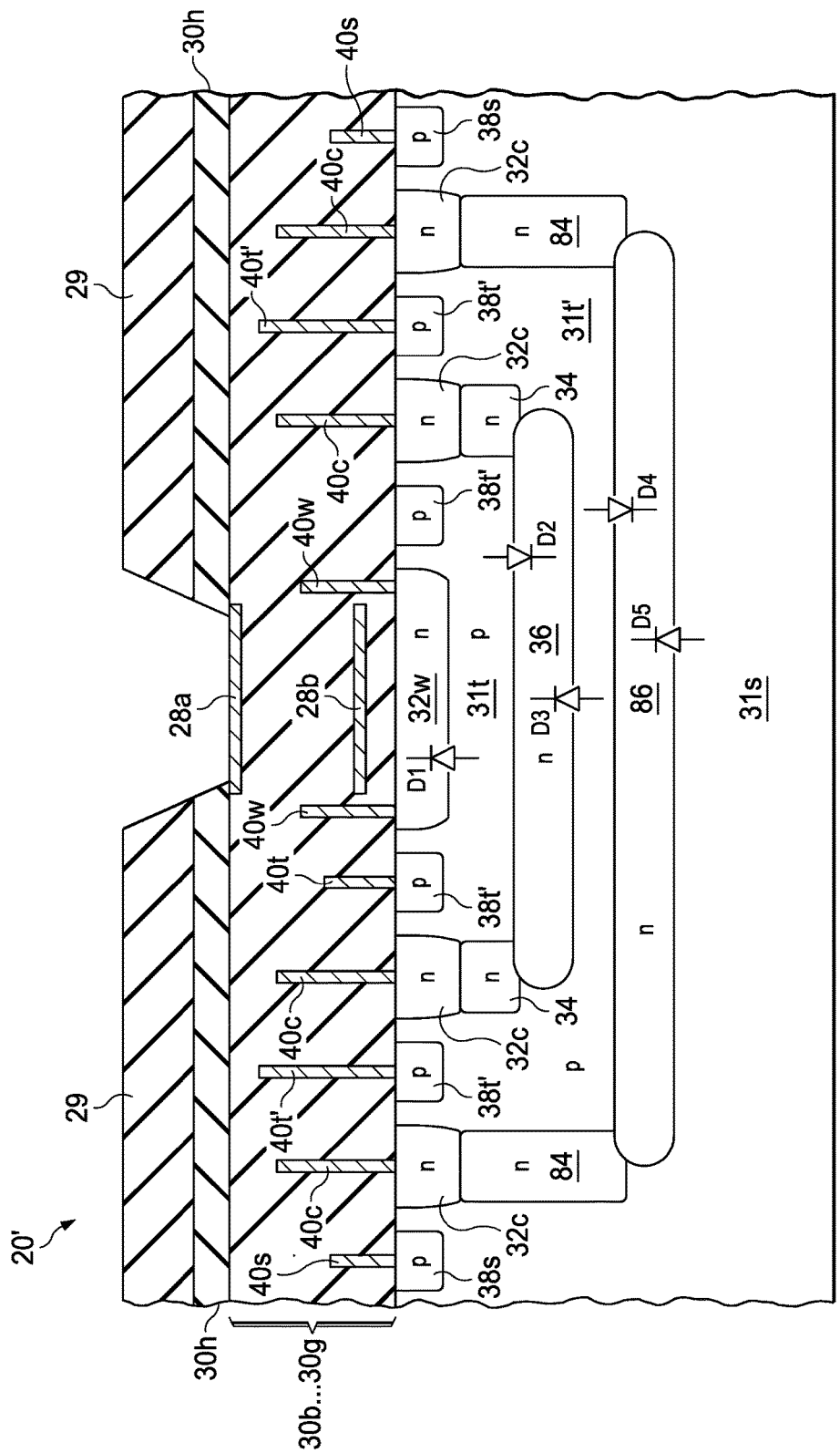
FIG. 5 is a cross-sectional view of a portion of an isolator structure constructed according to another disclosed embodiment.

The above embodiments incorporate isolator structure 20 into integrated circuit 16 in such a manner that a single isolated tank (p-type tank region 31t in FIG. 3a) is formed. However, it is contemplated that additional reduction in the parasitic capacitor may be attained by forming the structure so as to have multiple isolated tanks in series, essentially by forming multiple tank regions nested within one another so that additional series diodes and junction capacitances are present in the structure. FIG. 5 illustrates an embodiment of such an isolator structure 20', in which two such nested tanks are implemented as will now be described.

Isolator structure 20' of FIG. 5, according to this embodiment, includes many of the same components as described above relative to isolator structure 20 of FIGS. 3a and 3b; those common elements are indicated in FIG. 5 by the same reference numerals as used in connection with FIGS. 3a and 3b. As such, isolator structure 20' is realized by a parallel-plate capacitor formed by upper plate 28a and lower plate 28b formed in separate conductor levels, separated by dielectric material in one or more interlevel dielectric layers 30b through 30g, which serve as the capacitor dielectric. A wire bond (not shown) will be attached directly or indirectly to upper plate 28a in the manner described above, for example through the opening in protective overcoat 29 and interlevel dielectric layer 30h shown in FIG. 5. As in the embodiment described above, lower plate 28a of isolator structure 20' overlies n-type well 32w, with an interlevel dielectric layer and perhaps a gate dielectric layer separating lower plate 28a from well 32w. P-type tank region 31t underlies n-type well region 32w, isolated on all sides by n-type well region 32c and n-type buried isolation region, and beneath by n-type buried layer 36. As described above relative to FIG. 3a and as shown in FIG. 5, n-type buried layer 36 laterally extends beyond the lateral dimensions of n-well 32w, and is in contact with n-type buried isolation region 34.

According to this embodiment, a second isolated p-type tank region 31t' surrounds n-well region 32c, buried isolation region 34, and n-type buried layer 36. This second p-type tank region 31t' is itself surrounded by the n-type material of second n-type buried layer 86, buried isolation region 84, and another instance of n-well region 32c. Buried isolation region 84 extends deeper into the structure than buried isolation region 34, so as to contact the correspondingly deeper second n-type buried layer 86 and fully isolate second p-type tank region 31t' from p-type substrate 31s. P-type substrate 31s underlies deeper second n-type buried layer 86, and extends to the surface outside of n-type buried isolation region 84 and the second instance of n-well region 32c.

If isolator structure 20' were viewed from above (i.e. similarly as the plan view of FIG. 3b), the second p-type tank region 31t' would surround the inner n-well region 32w and would itself be surrounded at the surface by the second, outer, n-well region 32c.

According to this embodiment, one additional p-n junction (diode D4 of FIG. 5) is present between second tank region 31t' and second n-type buried layer 86, and another p-n junction (diode D5) is present between second n-type buried layer 86 and underlying substrate 31s. These diodes D4, D5 are in series with diodes D1 through D3 defined by the structure of n-well 32w, first p-type tank region 31t, and first n-type buried layer 36 (diode D3 at the p-n junction between n-type buried layer 36 and second p-type tank region 31t' in this case). As described above, these additional p-n junctions establishing diodes D4 and D5 each present a significant junction capacitance to the structure. These capacitances will be in series with the junction capacitances associated with diodes D1 through D3, and in series with the parasitic capacitor between lower plate 28b and n-well 32w. As such, these additional p-n junctions provided by the additional isolated p-tank region 31t' will further reduce the effective parasitic capacitance of isolator structure 20'.

If desired, metal conductors 40 may also similarly make contact to the various doped regions of isolator structure 20' to establish reverse bias conditions at each of the p-n junctions in the structure. As discussed above, a reverse bias voltage applied to the p-n junctions establishing diodes D1 through D5 will increase the junction capacitance at those locations, further reducing the parasitic capacitance of isolator structure 20'. In the same manner as discussed above relative to FIGS. 3a through 3d, this reverse bias condition can be applied to the junctions established by n-type buried layer 86 through conductors 40t' at doped regions 38t' within second tank 32t', additional conductors 40c at n-well region 32c (and at more heavily doped n-type regions within those wells, if desired), and conductors 40s at p-type doped regions 38s within surface portions of substrate 31s, as shown in FIG. 5. Conductors 40c and 40w will receive a positive voltage (e.g., a bias voltage Vbias of +1.8 volts) relative to the voltage (e.g., a bias voltage Vbias− at ground level) applied to conductors 40t, 40t', 40s. Also as discussed above, resistors (not shown) are preferably are provided in series with these conductors 40 and their respective voltage sources, to prevent short-circuiting of the junctions as the bias voltages are applied. Again, while these reverse bias voltages are not essential to obtain significant reduction of the parasitic capacitance, and as such is an optional feature, this bias further reduces the effective parasitic capacitance by increasing the junction capacitance of diodes D1 through D5.

It is contemplated that the additional n-type buried layer 86 and buried isolation regions 84 may be formed into the structure by way of conventional processes such as those described above relative to FIG. 4. For example, one approach to the fabrication of these regions would involve the repeating of implant processes 50, 52 and epitaxy process 54 after a first instance of those processes, as indicated by the dashed line from process 54 to process 50 as shown in FIG. 4. The two instances of buried isolation region implant process 52 would, in this example, be performed at the same locations so as to form the extended depth of buried isolation structure 84. Other processes for forming these nested isolated tanks are also contemplated.

According to these embodiments, an isolator structure with reduced effective parasitic capacitance, yet without reducing high voltage isolation performance, is provided. This structure is suitable for use either as a capacitive isolator or as an inductive isolator such as a transformer, and may be efficiently fabricated using manufacturing processes such as may be otherwise used or available for the integrated circuit into which the isolator structure is formed. It is contemplated that isolator structures according to some of these embodiments can enable fabrication of a lower plate or coil element in a lower conductor layer, including polysilicon levels, with tolerable parasitic capacitance as a result of these isolator construction, which can enable improved high voltage isolation performance.

While one or more embodiments have been described in this specification, it is of course contemplated that modifications of, and alternatives to, these embodiments, such modifications and alternatives capable of obtaining one or more the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of forming an integrated circuit, comprising:
   forming a buried doped layer of a first conductivity type in a semiconductor substrate, the semiconductor substrate having a second conductivity type;
   forming a buried isolation region of the first conductivity type in the semiconductor substrate so as to contact the buried doped layer;
   forming a plurality of well regions of the first conductivity type at a surface of the semiconductor substrate, a first one of the well regions formed into a tank region of the second conductivity type disposed above the buried doped layer and surrounded by the buried isolation region, and a second one of the well regions overlying and in contact with the buried isolation region;
   then forming a first dielectric layer over the surface of the semiconductor substrate;
   forming a first conductor element overlying the first dielectric layer at a location overlying the first well region;
   forming a second dielectric layer over the surface of the semiconductor substrate; and
   forming a second conductor element overlying the second dielectric layer at a location overlying the first conductor element.

2. The method of claim 1, wherein the step of forming the first conductor element comprises:
   depositing a first conductive layer over the first dielectric layer; and patterning the first conductive layer to define a first capacitor plate at the location overlying the first well region;
   and wherein the step of forming the second conductor element comprises:
   depositing a second conductive layer over the second dielectric layer; and
   patterning the second conductive layer to define a second capacitor plate at the location overlying the first capacitor plate.

3. The method of claim 1, wherein the step of forming the first conductor element comprises:
   depositing a first conductive layer over the first dielectric layer; and patterning the first conductive layer to define a first inductor coil at the location overlying the first well region;
   and wherein the step of forming the second conductor element comprises:
   depositing a second conductive layer over the second dielectric layer; and
   patterning the second conductive layer to define a second inductor coil at the location overlying the first capacitor plate.

4. The method of claim 1, further comprising:
   forming first and second contact regions of the second conductivity type at the surface of the semiconductor substrate, the first contact region disposed at a location of the surface of the semiconductor substrate between the first and second well regions and in contact with the tank region, and the second contact region disposed at a location of the surface of the semiconductor substrate outside of the second well region relative to the tank region and in contact with the surface of the semiconductor substrate.

5. The method of claim 4, further comprising:
   forming a plurality of metal conductors overlying the surface of the semiconductor substrate, respective ones of the plurality of metal conductors in ohmic contact with the first contact region, the second contact region, the first well region, and the second well region.

6. The method of claim 5, further comprising:
   forming a plurality of resistors near the surface of the semiconductor substrate, respective ones of the resistors in contact with respective ones of the plurality of metal conductors.

7. The method of claim 5, wherein the steps of forming the buried doped layer and forming the buried isolation region each comprise:
   implanting dopant of the first conductivity type into the surface of the semiconductor substrate;
   and further comprising:
   after the implanting steps, epitaxially growing silicon of the second conductivity type over the implanted regions to form the tank region overlying the buried doped layer.

8. The method of claim 1, further comprising:
   then forming a third dielectric layer overlying the second conductor element;
   etching an opening in the third dielectric layer to expose a portion of the second conductor element; and
   contacting the exposed portion of the second conductor element with a conductor in contact with an external terminal of the integrated circuit.

9. The method of claim 1, wherein the step of forming a buried doped layer comprises:
   forming first and second buried doped layers of the first conductivity type into the semiconductor substrate, the first buried doped layer underlying the second doped layer and separated therefrom by semiconductor material of the second conductivity type;
   wherein the step of forming a buried isolation region comprises:
   forming a first buried isolation region of the first conductivity type into the substrate so as to contact the first buried doped layer; and
   forming a second buried isolation region of the first conductivity type into the substrate so as to contact the second buried doped layer;
   wherein the second one of the well regions is overlying and in contact with the first buried isolation region, and
   wherein the step of forming a plurality of well regions also forms a third one of the well regions overlying and in contact with the second buried isolation region.

10. A method of forming an integrated circuit, comprising:
    forming a buried doped layer of a first conductivity type into a semiconductor substrate, the semiconductor substrate having a second conductivity type;
    forming a buried isolation region of the first conductivity type into the semiconductor substrate so as to contact the buried doped layer;
    forming a plurality of well regions of the first conductivity type at a surface of the semiconductor substrate, a first one of the well regions formed into a tank region of the second conductivity type disposed above the buried doped layer and surrounded by the buried isolation region, and a second one of the well regions overlying and in contact with the buried isolation region;
    then forming a first dielectric layer over the surface of the semiconductor substrate;
    forming a first conductor element overlying the first dielectric layer at a location overlying the first well region;
    forming a second dielectric layer over the surface of the semiconductor substrate; and forming a second conductor element overlying the second dielectric layer at a location overlying the first conductor element;

then forming a third dielectric layer overlying the second conductor element;

etching an opening in the third dielectric layer to expose a portion of the second conductor element; and contacting the exposed portion of the second conductor element with a conductor in contact with an external terminal of the integrated circuit.

11. The method of claim 10, wherein the step of forming the first conductor element comprises:

depositing a first conductive layer over the first dielectric layer; and patterning the first conductive layer to define a first capacitor plate at the location overlying the first well region;

and wherein the step of forming the second conductor element comprises:

depositing a second conductive layer over the second dielectric layer; and patterning the second conductive layer to define a second capacitor plate at the location overlying the first capacitor plate.

12. The method of claim 10, wherein the step of forming the first conductor element comprises:

depositing a first conductive layer over the first dielectric layer; and patterning the first conductive layer to define a first inductor coil at the location overlying the first well region;

and wherein the step of forming the second conductor element comprises:

depositing a second conductive layer over the second dielectric layer; and patterning the second conductive layer to define a second inductor coil at the location overlying the first capacitor plate.

13. The method of claim 10, further comprising:

forming first and second contact regions of the second conductivity type at the surface of the semiconductor substrate, the first contact region disposed at a location of the surface of the semiconductor substrate between the first and second well regions and in contact with the tank region, and the second contact region disposed at a location of the surface of the semiconductor substrate outside of the second well region relative to the tank region and in contact with the substrate.

14. The method of claim 13, further comprising:

forming a plurality of metal conductors overlying the surface of the semiconductor substrate, respective ones of the plurality of metal conductors in ohmic contact with the first contact region, the second contact region, the first well region, and the second well region.

15. The method of claim 14, further comprising:

forming a plurality of resistors near the surface of the semiconductor substrate, respective ones of the resistors in contact with respective ones of the plurality of metal conductors.

16. The method of claim 14, wherein the steps of forming the buried doped layer and forming the buried isolation region each comprise:

implanting dopant of the first conductivity type into the surface of the semiconductor substrate;

and further comprising:

after the implanting steps, epitaxially growing silicon of the second conductivity type over the implanted regions to form the tank region overlying the buried doped layer.

* * * * *